United States Patent
Muller et al.

(10) Patent No.: US 8,971,147 B2
(45) Date of Patent: Mar. 3, 2015

(54) CONTROL GATE WORD LINE DRIVER CIRCUIT FOR MULTIGATE MEMORY

(71) Applicants: Gilles Muller, Austin, TX (US); Ronald J. Syzdek, Austin, TX (US)

(72) Inventors: Gilles Muller, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/663,636

(22) Filed: Oct. 30, 2012

(65) Prior Publication Data

US 2014/0119132 A1    May 1, 2014

(51) Int. Cl.
 *G11C 8/00* (2006.01)
 *G11C 8/08* (2006.01)
(52) U.S. Cl.
 CPC .................................. *G11C 8/08* (2013.01)
 USPC ................. 365/230.06; 365/230.03
(58) Field of Classification Search
 None
 See application file for complete search history.

(56) References Cited

U.S. PATENT DOCUMENTS

| | | | |
|---|---|---|---|
| 5,365,479 A | 11/1994 | Hoang et al. | |
| 6,724,648 B2 | 4/2004 | Khellah et al. | |
| 7,533,226 B2 | 5/2009 | Flautner et al. | |
| 2002/0064070 A1 | 5/2002 | Yamazaki et al. | |
| 2005/0213385 A1 | 9/2005 | Hosono et al. | |
| 2012/0235218 A1* | 9/2012 | Kutsukake et al. | 257/314 |

FOREIGN PATENT DOCUMENTS

WO    2012128134 A1    9/2012

OTHER PUBLICATIONS

Kobayashi, S. et al., "Memory Array Architecture and Decoding Scheme for 3 V Only Sector Erasable DINOR Flash Memory", IEEE Jornal of Solid-State Circuits, vol. 29, No. 4, Apr. 1994, pp. 454-460.

* cited by examiner

*Primary Examiner* — Kretelia Graham
(74) *Attorney, Agent, or Firm* — David G. Dolezal; Mary Jo Bertani

(57) ABSTRACT

A memory having an array of multi-gate memory cells and a word line driver circuit coupled to a sector of memory cells of the array. In at least one mode of operation, the word line driver circuit is controllable to place an associated control gate word line coupled to the control gate word line driver and coupled to the sector in a floating state during a read operation where the sector is a non selected sector.

18 Claims, 4 Drawing Sheets

| | CGWL OF CELLS BEING ACCESSED | CGWL OF CELLS NOT BEING ACCESSED |
|---|---|---|
| FULL POWER STAND BY | N/A | VREAD |
| FULL POWER READ | VREAD | VREAD |
| FULL POWER PROGRAM/ERASE | VPROGRAM/ERASE | VREAD |
| LOW POWER STOP | N/A | FLOATING |
| LOW POWER READ | VREAD | FLOATING |

FIG. 3

| | CGWLS* | SEL | TCS | BCS | VCGTOP | VCGBOT |
|---|---|---|---|---|---|---|
| FULL POWER STAND BY | H | L | H | H | VREAD | VREAD |
| FULL POWER READ | H | L | H | H | VREAD | VREAD |
| FULL POWER PROGRAM/ERASE | ACTIVE | L | CGWLS* | CGWLS* | VPROGRAM/ERASE | VREAD |
| LOW POWER STOP | H | H | H | L | VDD | VDD |
| LOW POWER READ | ACTIVE | H | H | CGWLS*BAR | VREAD | VREAD |

FIG. 4

CONTROL GATE WORD LINE DRIVER CIRCUIT FOR MULTIGATE MEMORY

BACKGROUND OF THE INVENTION

1. Field of the Invention

This invention relates in general to memories and more specifically to a control gate word line driver circuit of a multi-gate memories.

2. Description of the Related Art

A multigate memory is a memory whose memory cells include two independently biased gates (a control gate and a select gate). In some examples, the control gate and select gate are part of the same transistor of the memory cell such as in a split gate memory cell, but they may be located in separate transistors in other types of multigate memories (e.g. as in a 2-T memory cell). The control gate is coupled to a control gate word line and the select gate is coupled to a select gate word line. The memory cell is accessed by asserting both the control gate word line and select gate word line.

BRIEF DESCRIPTION OF THE DRAWINGS

The present invention may be better understood, and its numerous objects, features, and advantages made apparent to those skilled in the art by referencing the accompanying drawings.

FIG. 3 is a table showing the status of a control gate word line voltage during different operations of a memory according to one embodiment of the present invention.

FIG. 4 is a table showing the state of various nodes of a control gate word line driver during different operations according to one embodiment of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

A multigate memory is described where non selected control gate word lines are floating (i.e. in a high impedance state) during a read of a selected row of the array. In some examples, the control gate word lines are placed in a floating state during low power operations. For example, during a low power read, only the control gate word line of a sector of the cell or cells being read is brought to a read voltage level where the other control gate word lines remain at the floating state.

With some memories, it is desirable to read a multigate memory in a low power mode. In some prior art memories, circuitry of the memory is disabled in the low power mode. When a cell is to be read in a low power mode, the circuitry is powered up to perform the read. With this technique, the circuitry may take an undesirable amount of time to power up from being disabled in the low power mode.

Another technique for reading in a low power mode is to maintain analog biases required for reading with capacitive nodes. This technique requires the implementation of additional capacitive structures in the memory and may also require more power to change the voltage of the capacitive nodes during normal operation.

Another prior art technique is to lower the control gate voltages of the memory cells to a lower voltage during a low power mode. The control gate voltages are then raised for all of the cells to perform the read. One problem with this implementation is that the control gate word lines can have high capacitances. Raising the voltage of multiple high capacitance word lines may take longer than desired and may also consume additional power.

Figure 1:
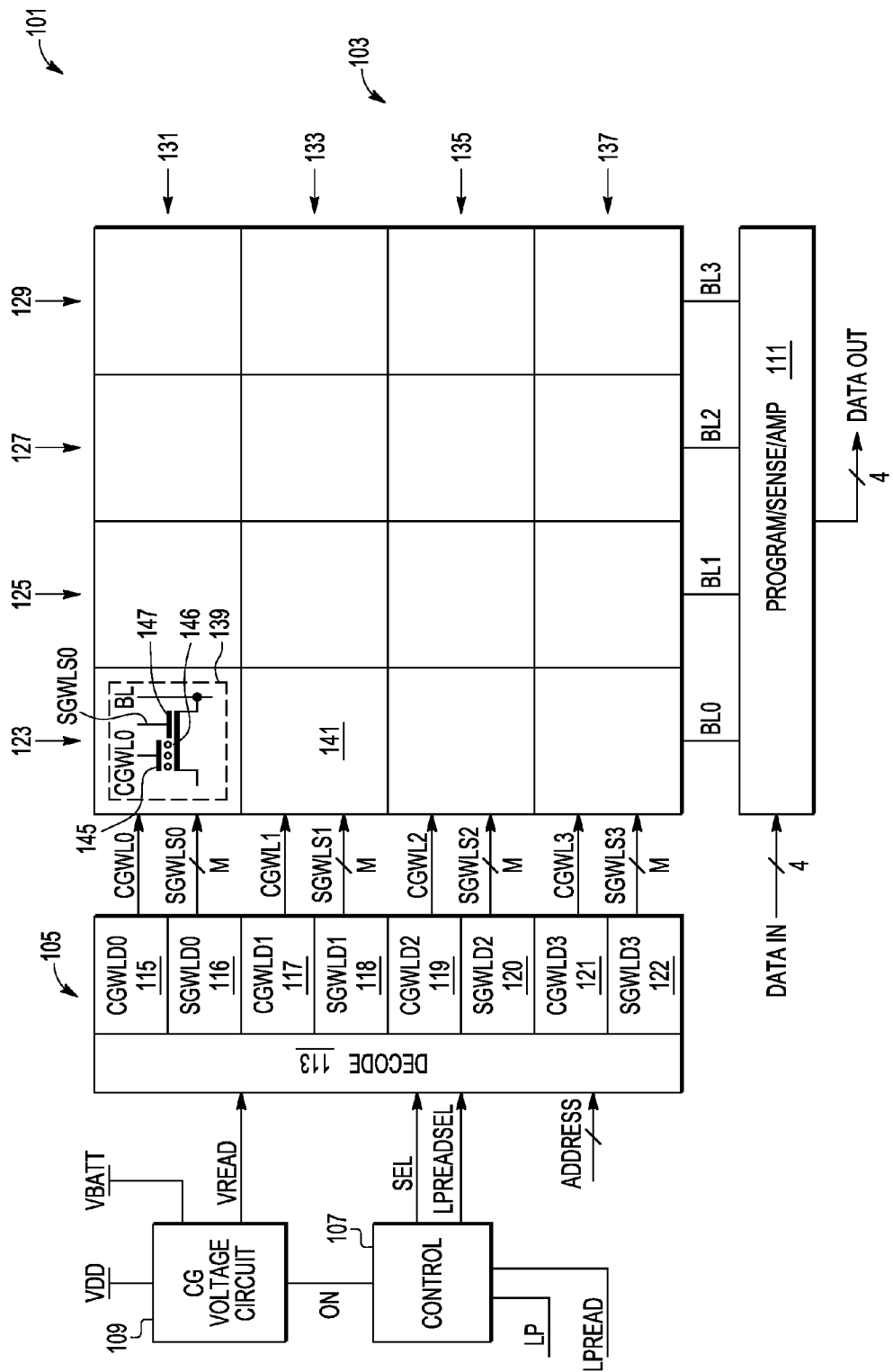
FIG. 1 is a circuit diagram of a portion of a memory according to one embodiment of the present invention.

FIG. 1 is a block diagram of portions of a multigate memory 101 according to one embodiment of the present invention. In the embodiment shown, memory 101 includes an array 103 of multigate memory cells with cell 139 shown schematically in FIG. 1. In one embodiment, the memory cells of array 103 are split gate memory cells, but may be other types of memory cells in other embodiments. Memory 101 may be a standalone device or may be implemented in an integrated circuit with processing circuitry such as in a microcontroller.

The split gate memory cell is a non volatile memory cell that includes a charge storage structure (146) where charge is stored during a program operation to adjust the threshold voltage of the cell to store a particular logic value. Charge is removed during an erase operation such that the cell reads an opposite logic value. The multigate memory cell includes a control gate (e.g. 145) and a select gate (e.g. 147).

Memory 101 includes a controller 107, a word line control circuit 105, a control gate voltage circuit 109, and a program/sense amp circuitry 111 for reading and writing data to and from the cells of array 103. In the embodiment shown, the cells of array 103 are accessed by an address provided on address lines (e.g. from a processing circuit). The address is provided to a decode circuitry 113 of word line control circuit 105. Word line control circuit 105 includes decode circuitry 113 that decodes the address provided on the address lines to activate the specific select gate word line of the row of cells designated by the address.

In the embodiment shown, array 103 includes 4 columns 123, 125, 127, and 129 of memory cells, where each column of cells is coupled to a bit line (e.g. BL0, BL1, BL2, and BL3, respectively). The bit lines are used by the program/sense amp circuitry 111 to write, and read values of the cells as determined by the asserted word lines. Circuitry 111 receives data to be written to the memory from the data in lines and provides the data read from memory on the data out lines. In the embodiment shown, each bit line is coupled to one sense amplifier for reading the cells on the bit line. However in other embodiments, circuitry 111 may include selection circuitry (e.g. multiplexers) that allow multiple bit lines to be selectively coupled to a sense amplifier.

Controller 107 receives control signals for controlling the operation of memory 101, including the operations of circuit 105 and circuitry 111. The LP signal line carries an LP signal used to place memory 101 in a low power mode to consume less power. The LPREAD signal line carries the LPREAD signal which is used to indicate a read in the low power mode. Controller 107 may receive other control signals e.g. a write signal, an erase signal, or clock signal (not shown). Also, a controller of other embodiments may receive other types of control signals.

Figure 5:
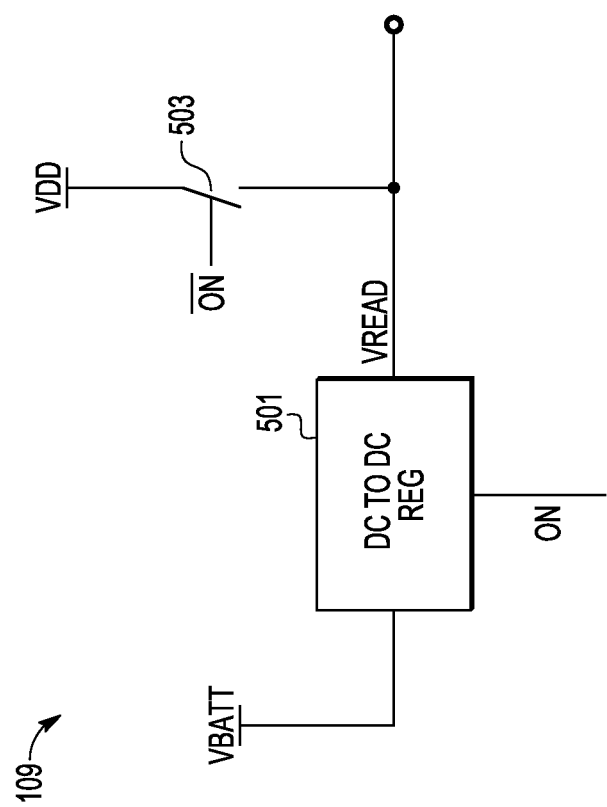
FIG. 5 is a circuit diagram of a control gate voltage circuit according to one embodiment of the present invention.

Memory 101 includes a control gate voltage circuit 109 that provides the voltage (VREAD) to the control gate word line drivers (e.g. 115). In the embodiment shown, circuit 109 receives a VDD voltage from a regulator circuit and receives a voltage (VBATT) from a battery (not shown). In an embodiment shown in FIG. 5, circuit 109 includes a DC to DC voltage regulator 501 that, when the ON signal from controller 107 is asserted, converts the voltage from the battery (VBATT) to a VREAD voltage. In one embodiment, circuit 109 includes a relatively "weak" keeper switch 503 that is made conductive to connect the VREAD line to the VDD terminal to provide a VDD voltage when the ON signal is de-asserted and the DC-DC regulator 501 is disabled. However, other control gate voltage circuits may have other configurations in other embodiments, including having a multiplexer to provide the different voltages. In one embodiment, VDD is 1.2 Volts, VBATT ranges between 1.7-3.6 volts, and VREAD during a full power mode is 1.5 volts. However, other embodiments may use other voltage levels.

Referring back to FIG. 1, array 103 includes four sectors 131, 133, 135, and 137. Each sector receives one control gate word line (e.g. CGWL0) and a set of M select gate word lines (e.g. SGWLS0), where M is an integer of 1 or greater. Each sector includes M rows of memory cells where each select gate word line of a select gate word line set is coupled to the select gates (e.g. 147) of a row. The cells of a row are selectively accessed by asserting the particular select gate word line associated with the row. The particular select gate word line asserted during a memory access is determined by decode circuitry 113 from the address received on the address lines.

Circuit 105 includes select gate word line drivers 116, 118, 120 and 122. Each of the select gate word line drivers (e.g. 116) is configured to provide M select gate word line signals to the rows of a sector (e.g. 131).

Circuit 105 includes control gate word line drivers 115, 117, 119, 121. Each control gate word line driver (e.g. 115) is configured to provide a control gate word line signal on its control gate word line (e.g. CGWL0). In some embodiments during a full power or normal read mode, all of the control gate word lines are powered at the VREAD voltage. In the embodiment shown, each of the blocks (e.g. 141) represent a portion of a column of cells whose control gates are coupled to the same control gate word line.

To access a multigate memory cell, both the control gate word line and the select gate word line of the cell are asserted. In the embodiment shown, array 103 is an array of 4×4×M cells. However, arrays of other embodiments may be of difference sizes including a different number of cells, columns, rows and/or sectors. Also, a memory array may have other configurations in other embodiments.

Figure 2:
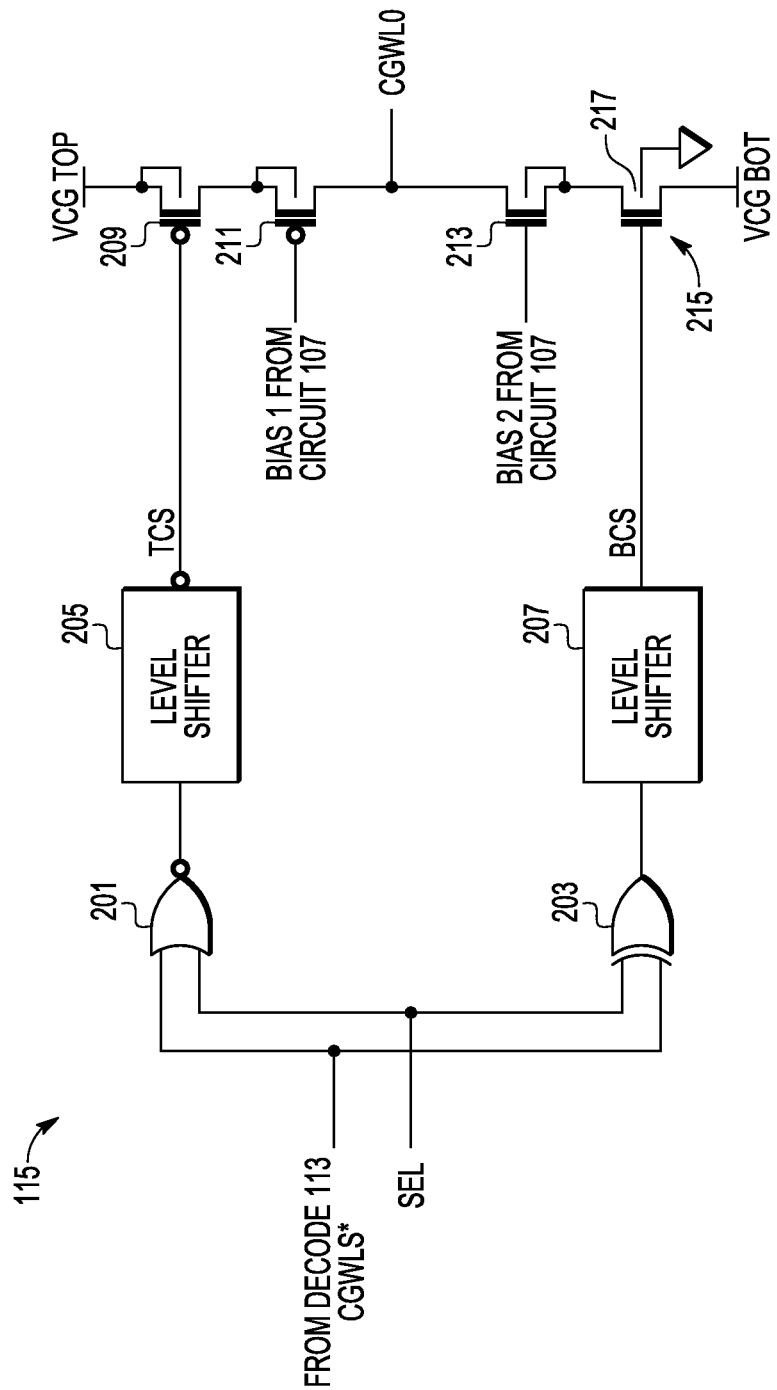
FIG. 2 is a circuit diagram of a control gate word line driver according to one embodiment of the present invention.

FIG. 2 is a circuit diagram of a control gate word line driver (e.g. 115) of word line control circuit 105. Driver 115 includes NOR gate 201, XOR gate 203, and level shifters 205 and 207. Driver 115 also includes a stack of transistors including P-channel transistor 209 (a PMOS device in the embodiment shown), a P-channel transistor 211, an N-channel transistor 213 (an NMOS device in the embodiment shown), and N-channel transistor 215. The source of transistor 209 is tied to VCGTOP terminal and the source of transistor 215 is tied to VCGBOT terminal. In one embodiment, terminals VCGTOP and VCGBOT are connected to multiplexing circuits that can provide multiple voltages to the terminals including VREAD from circuit 109.

NOR Gate 201, XOR gate 203 and level sifters 205 and 207 are used to control the voltages of the gates of transistor 209 and 215 to control the voltage of the control gate word line based on signals CGWLS* and SEL provided from decode circuitry 113 and controller 107, respectively. The CGLS* signal is an asserted low signal provided by decode circuitry 113 that indicates that an address received by the decode circuitry 113 is to a row that is in the sector associated with the control gate word line. For example, the CGWLS* signal in FIG. 2 is low if the received address indicates an access to a row of sector 131. Otherwise, the voltage of CGWLS* is at a high voltage. The CGWLS* signal may be produced in a number of different ways depending upon the configuration of decode circuitry 113. For example, circuitry 113, may includes precoders where the CGWLS* signal is a logical NAND of multiple precoder outputs. In some embodiments, the decode circuitry 113 gates the CGWLS* signal based upon the type of operation being performed (see the discussion of FIG. 4).

The select signal (SEL) is provided by controller 107 and is used to change the operation of driver 115 when in a low power mode versus a full power mode. Level shifters 205 and 207 are used to change the voltage levels of the outputs of gates 201 and 203 respectively to account for changes in the voltage levels provided to the VCGTOP terminal and the VCGBOT terminal during the operation of the memory. As discuss below with respect to FIG. 3, the voltage levels of those terminals are adjusted depending upon the operation being performed. Accordingly, the signals from gates 201 and 203 are shifted to ensure the proper operation of transistors 209 and 215. The gate of transistor 209 is connected to an inverting output of level shifter 205 in that signal TCS is an inverted signal from the logic level of the output of NOR gate 201.

Transistors 211 and 213 are utilized as protection transistors for protecting transistors 209 and 215 from breakdown damage when program and erase voltages are applied to the VCGTOP terminal. The bias voltage applied to the gates of transistors 211 and 213 are controlled by controller 107 and are adjusted based on the operation being performed. In one embodiment, during read operations, transistor 211 and 213 are in a fully conductive state.

In the embodiment shown, the bodies of transistors 209, 211, and 213 are tied to their sources. The body 217 of transistor 215 is tied to a ground terminal in the embodiment shown. However, body 217 may be tied to a terminal that provides a voltage that is less than the voltage provided by the VCGBOT terminal in other embodiments.

FIG. 3 sets forth a table showing the voltage states of a control gate word line (CGWL) produced by a control gate word line driver 115 based on the operations being performed by a memory. The operations listed in FIG. 3 includes a full power standby, a full power read, a full power program/erase, a low power stop, and a low power read. A full power standby operation is where the memory is at full power but the no memory access operations are being performed. A full power read is where cells of the memory are being read during full power. A full power program/erase operation is where cells are being programmed or erased. A low power stop is where the memory is in a low power mode and no memory access operations are being performed. A low power read is where cells are being read in a lower power mode. A low power mode is of mode of the memory where at least some of circuitry of a memory is operated to consume less power than during a full power mode.

The first column of FIG. 3 shows the status of the control gate word line when a cell or cells of the sector are being accessed during the operations. An "N/A" indicates that no cells are being accessed during the operation such as during a full power standby or a low power stop. The second column of FIG. 3 shows the status of a control gate word lines where no cells of the sector of the word line is being accessed during the operation.

As shown in FIG. 3, during a full power mode, the control gates of the sectors whose cells are not accessed are biased at VREAD (produced by circuit 109). During a full power read, the control gates of a sector that includes the cells being read are also biased at the VREAD voltage. During a full power program or erase operation, the voltage of the selected control gate word line is adjusted (typically raised) to a program or erase voltage. The non selected control gate word lines are biased at VREAD during a program or erase operation. In one embodiment, the program/erase voltage is 9 volts/15 volts respectively, but may be of other values in other embodiments. Biasing the voltage of the control gate word line to VREAD of sectors not being accessed or during full power standby allows for subsequent reads to be performed faster in that the voltage level of the control gate word line of the sector of cells being read does not have to be adjusted to perform the read.

In a low power standby mode, all of the control gate word lines are placed in a floating state (a high impedance state). When a read in the low power mode is made to a row of cells, the control gate word line of the sector of that row is biased at VREAD for the lower power read. The control gate word lines of the other sectors not having cells being read (non selected sectors) remain at the floating state during the low power read.

During a low power mode, controller 107 de-asserts the ON signal provided to control gate voltage circuit 109. In some embodiments, when the ON signal is de-asserted, the controller 107 disables its DC-DC voltage regulator 501 to conserve power. By keeping the control gate word lines in a floating state and only providing the VREAD voltage on the control gate word line of the sector being read, the voltage level of the output of circuit 109 can be more quickly brought back to VREAD from a lower disabled voltage level (VDD). If all of the control gate word lines of the memory were coupled to circuit 109 in a low power mode, it would take the regulator 501 of circuit 109 longer to raise the voltage to VREAD from VDD due to the total capacitance of the control gate word lines of memory 101. With the embodiment shown, by having only one control gate word line coupled to circuit 109 during a low power read, the capacitance on the output of circuit 109 is reduced significantly, allowing the voltage level to be raised faster, and with less power consumed. In some embodiments, by placing the control gate word lines in a floating state during a low power mode, a memory may be able to perform a lower power read in less than a microsecond.

FIG. 4 shows the logic levels and voltage states applied to the nodes of FIG. 2 during various operations of a memory circuit according to one embodiment of the present invention. The operations shown in the table of FIG. 4 are the same operations shown in FIG. 3.

In the embodiment of FIG. 4, the term "active" for the CGWLS* signal indicates that the logic value of that signal depends on whether cells of the sector of the word line driver are accessed during an access operation. If cells of the sector are being accessed, then the value of CGWLS* is an asserted low voltage logic value. If there are no cells of the sector being accessed, then the value of CGWLS* is a logical high value. For some operations (e.g. full power standby, full power read, and low power stop) the CGWLS* signal is inactive and is at a logical high voltage value (H). For these operations, decode circuitry 113 deactivates the CGWLS* signal. For these operations, the status of the control gate word line is not dependent on the address of the address lines.

In the TCS and BCS columns, the indication of CGWLS* indicates that the logical voltage value of that signal is the logical voltage value of the CGWLS* signal. The indication of "CGWLS*BAR" indicates that the logical voltage value is the opposite of the logical voltage value of the CGWLS* signal.

During full power standby and during a full power read, the CGWLS* is high and the SEL signal is low (indicating a full power operation). Accordingly, the TCS and BCS signals are both at a high voltage values. During these operations, the VREAD voltage is provided to both the VCGTOP and VCGBOT terminals. TCS being at a high voltage value causes transistor 209 to be non conductive and BCS being at high voltage value causes transistor 215 to be conductive to pull CGWL0 to the VREAD voltage via the VCGBOT terminal.

During a full power program or erase operation, VCGTOP is biased at the program or erase voltage and the VCGBOT terminal is biased at VREAD. Because CGWLS* is active, the value of TCS and BCS will depend upon whether the sector has cells that are to be programmed or erased. If the sector has cells that are to be programmed or erased, then CGWLS* is low which causes both TCS and BCS to be low. TCS and BCS being low causes transistor 209 to be conductive and transistor 215 to be non conductive. With 209 being conductive and VCGTOP being biased at the program or erase voltage, the voltage of CGWL0 is pulled to the program or erase voltage. If the sector does not have any cells that are to be programmed or erased, then CGWLS* is high which causes both TCS and BCS to be at a high voltage. TCS and BCS being at a high voltage causes transistor 209 to be non conductive and transistor 215 to be conductive. With transistor 215 being conductive and VCGBOT being biased at VREAD, the voltage of CGWL0 is pulled to the VREAD voltage via terminal VCGBOT.

In a low power stop operation, the CGWLS* signal is inactive (a high voltage level) and the SEL signal is low to indicate a low power mode. This causes the TCS signal to be high and the BCS signal to be low. During a low power stop, the terminals VCGTOP and VCGBOT are coupled to the output of circuit 109 and therefore biased at the lower VDD voltage due to the regulator 501 of circuit 109 being off. With TCS being at a high voltage and BCS being at a low voltage, both transistors 209 and 215 are non conductive which places CGWL0 in a floating state.

During a low power read operation, the CGWLS* signal is active and the SEL signal is at a high voltage level. Accordingly, the TCS signal will be at a high voltage and the BCS signal will be at an opposite voltage logic level to the CGWLS* signal. The TCS signal being at a high voltage level causes transistor 209 to be non conductive. If the word driver is associated with a sector having cells being read, CGWLS* will be low and the BCS signal will be high. The BCS signal being high causes transistor 215 to be conductive which pulls the voltage of CGWL0 to the voltage of VREAD since terminal VDGBOT is coupled to the output of circuit 109 and the regulator 501 of circuit 109 is enabled during a low power read.

However, if no cells of the sector associated with the word line driver are being read, then CGWLS* will be high and the BCS signal will be low which causes transistor 215 to be non conductive. With transistor 209 also being non conductive during a low power read, CGWS0 will be floating.

In other embodiments, memory 101 may perform other operations where different voltages are applied to the VCGTOP terminal and/or VCGBOT terminal.

In the embodiment shown, during a floating state of the low power operation, the voltage of a control gate word line is clamped by the voltages of the P-well (body) 217 of N-channel transistor 215 and the N-well body of transistor 209. During the low power stop operation, VCGTOP terminal is biased at VDD through a weak keeper transistor switch 503 of circuit 109 (which is conductive when the ON signal is de asserted). Accordingly, the voltage of the control gate word line of a low power stop is clamped between a lower voltage that is a diode drop below the voltage of body 217 (ground in the embodiment shown) and a higher voltage that is a voltage drop above the voltage of VDD. During a low power read, the voltage of the non selected control gate word lines is clamped by the higher voltage of a voltage drop above VREAD due to VCGTOP being biased at VREAD.

In some embodiments, during a transition from a low power read to a low power stop operation, utilizing a relatively "weak" keeper switch 503 provides for a slower discharge of the voltage of the output of regulator 501 from the VREAD voltage to VDD. In embodiments having frequent low power reads, this slower discharge time may advantageously reduce the time and power needed to charge the output of regulator 501 back to the VREAD voltage for a subsequent low power read in that the voltage may not have fully discharged to VDD from the last low power read.

Embodiments of the circuits described herein provide a memory having two different read modes. One mode being a faster read mode (e.g. the full power mode), the other being a slower read mode but consumes less power. Accordingly, such a circuit provides flexibility in speed and power consumption. In some embodiments, memory 101 may be programmable where a system manufacture can configure the memory to operate in a low power read mode of all read operations.

In other embodiments, a memory may perform all reads in the "low power mode" where all control gate word lines are floating when no cells of its associate sector are being read. Thus, during a "full power" read operation, the control gate word lines of sectors having no cells being read would be floating (at a high impedance state). Also, the control gate word lines may be floating during a full power standby Other controllers 107 may have other configurations in other embodiments. In addition, other memories may perform operations differently with different bias voltages. Accordingly, the logic circuitry (see FIG. 2) for controlling a control gate word line may be varied accordingly. The term "in at least one mode" applies to memories that include multiple modes (e.g. full power mode, low power mode) and memories that are not multimode memories (e.g. single mode memories).

In one embodiment, a memory includes an array of multi-gate memory cells, an address decoder, and a control gate word line driver circuit coupled to the address decoder and coupled to a sector of memory cells of the array. The control gate word line driver circuit is controllable to place an associated control gate word line coupled to the control gate word line driver and coupled to the sector in a floating state during a read operation in at least one mode of operation where the sector is a non selected sector.

In another embodiment, a method includes, during a read operation to cells of an array of multi-gate memory cells of a memory, operating control gate word lines associated with non selected sectors of the array in a floating state. The control gate word lines are of a plurality of control gate word lines each associated with a sector of a plurality of sectors of the array. The method includes concurrently with the operating, applying a read voltage to a control gate word line associated with a selected sector of the array. The selected sector including memory cells being read during the read operation. The control gate word line associated with the selected sector being a control gate word line of the plurality of control gate word lines.

In another embodiment, a memory includes an array of multi-gate memory cells arranged in a plurality of sectors. Each memory cell of the array includes a control gate. The memory includes a plurality of control gate word lines each coupled to an associated sector of the plurality of sectors. The memory further includes a plurality of driver circuits each coupled to an associated control gate word line of the plurality of control gate word lines. Wherein during a read operation in at least one mode of operation, the driver circuits of the plurality of driver circuits operate non selected control gate word lines of the plurality of control gate word lines in a floating state and apply a read voltage to a control gate word line of the plurality of control gate word lines associated with a selected sector of the plurality of sectors.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
    an array of multi-gate memory cells;
    an address decoder;
    a control gate word line driver circuit coupled to the address decoder and coupled to a sector of memory cells of the array, the control gate word line driver circuit is controllable to place an associated control gate word line coupled to the control gate word line driver circuit and coupled to the sector in a floating state during a read operation in at least one mode of operation where the sector is a non selected sector;
    a plurality of control gate word line driver circuits including the control gate word line driver circuit, each control gate word line driver circuit of the plurality of control gate word line driver circuits is coupled to an associated sector of memory cells of the array via an associated control gate word line of a plurality of control gate word lines, during a read operation in at least a first mode of operation, each of the control gate word line driver circuits of the plurality of control gate word line driver circuits coupled to a non selected sector of the array places its associated control gate word line in a floating state and a control gate word line driver circuit of the plurality of control gate word line driver circuits coupled to a selected sector of the array applies a read voltage to its associated control gate word line of the plurality of control gate word lines;
    wherein during a read operation in a second mode of operation, each of the control gate word line driver circuits of the plurality of control gate word line driver circuits coupled to a non selected sector of the array applies a read voltage to its associated control gate word line of the plurality of control gate word lines.

2. A memory comprising:
    an array of multi-gate memory cells;
    an address decoder;
    a control gate word line driver circuit coupled to the address decoder and coupled to a sector of memory cells of the array, the control gate word line driver circuit is controllable to place an associated control gate word line coupled to the control gate word line driver circuit and coupled to the sector in a floating state during a read operation in at least one mode of operation where the sector is a non selected sector;

wherein the control gate word line driver circuit includes a P-channel transistor and an N-channel transistor, each of the P-channel transistor and the N-channel transistor is coupled to the associated control gate word line, wherein during a read in the at least one mode of operation, the P-channel transistor is non conductive, the N-channel transistor is conductive if the sector is a selected sector, and the N channel transistor is non conductive if the sector is a non selective sector.

3. The memory of claim 2 wherein during a read operation in a second mode of operation, the P-channel transistor is non conductive and the N-channel transistor is conductive whether the sector is a selected sector or non selected sector.

4. The memory of claim 2, the control gate word line driver circuit further comprising:
   a first level shifter circuit that provides a gate voltage to a gate of the N-channel transistor; and
   a second level shifter circuit that provides an inverse gate voltage to a gate of the P-channel transistor.

5. A memory comprising:
   an array of multi-gate memory cells;
   an address decoder;
   a control gate word line driver circuit coupled to the address decoder and coupled to a sector of memory cells of the array, the control gate word line driver circuit is controllable to place an associated control gate word line coupled to the control gate word line driver circuit and coupled to the sector in a floating state during a read operation in at least one mode of operation where the sector is a non selected sector;
   wherein during the at least one mode of operation, the control gate word line driver circuit places the associated control gate word line in a floating state when no access operations are being performed to the array.

6. The memory of claim 5 further comprising:
   a voltage regulator to provide a read voltage when enabled to the control gate word line driver circuit during a read of memory cells of the sector, wherein during the at least one mode of operation, the voltage regulator is not enabled when no access operations are being performed to the array.

7. The memory of claim 6, wherein during a read during the at least one mode of operation, the voltage regulator transitions from a non enabled state to an enabled state with a selected control gate word line of a plurality of control gate word lines of the memory receiving power from the voltage regulator and no non selected control gate word lines of the plurality of control gate word lines receiving power from the voltage regulator.

8. The memory of claim 5 wherein during a second mode of operation, the control gate word line driver circuit applies a read voltage to the associated control gate word line when no access operations are being performed to the array.

9. The memory of claim 5 further comprising:
   a plurality of control gate word line driver circuits including the control gate word line driver circuit, each control gate word line driver circuit of the plurality of control gate word line driver circuits is coupled to an associated sector of memory cells of the array via an associated control gate word line of a plurality of control gate word lines, during a read operation in at least a first mode of operation, every control gate word line driver circuit of the plurality of control gate word line driver circuits coupled to a non selected sector of the array places its associated control gate word line in a floating state and a control gate word line driver circuit of the plurality of control gate word line driver circuits coupled to a selected sector of the array applies a read voltage to its associated control gate word line of the plurality of control gate word lines.

10. A method comprising:
    during a read operation to cells of an array of multi-gate memory cells of a memory, operating control gate word lines associated with non selected sectors of a plurality of sectors of the array in a floating state, the control gate word lines are of a plurality of control gate word lines, each of the plurality of control gate word lines is associated with a sector of the plurality of sectors;
    concurrently with the operating, applying a read voltage to a control gate word line associated with a selected sector of the plurality of sectors of the array, the selected sector including memory cells being read during the read operation, the control gate word line associated with the selected sector being a control gate word line of the plurality of control gate word lines;
    wherein the operating and applying are performed during a first mode of operation;
    during a second read operation in a second mode of operation, applying a read voltage to the control gate word lines of the plurality of control gate word lines associated with selected and non selected sectors of the plurality of sectors of the array.

11. A method comprising:
    during a read operation to cells of an array of multi-gate memory cells of a memory, operating control gate word lines associated with non selected sectors of a plurality of sectors of the array in a floating state, the control gate word lines are of a plurality of control gate word lines, each of the plurality of control gate word lines is associated with a sector of the plurality of sectors;
    concurrently with the operating, applying a read voltage to a control gate word line associated with a selected sector of the plurality of sectors of the array, the selected sector including memory cells being read during the read operation, the control gate word line associated with the selected sector being a control gate word line of the plurality of control gate word lines;
    wherein during at least a first mode of operation, operating the control gate word lines of the plurality of control gate word lines in a floating state when no access operations are being performed to the array.

12. The method of claim 11, wherein during a second mode of operation, applying a read voltage to the control gate word lines of the plurality of control gate word lines when no access operations are being performed to the array.

13. A method comprising:
    during a read operation to cells of an array of multi-gate memory cells of a memory, operating control gate word lines associated with non selected sectors of a plurality of sectors of the array in a floating state, the control gate word lines are of a plurality of control gate word lines, each of the plurality of control gate word lines is associated with a sector of the plurality of sectors;
    concurrently with the operating, applying a read voltage to a control gate word line associated with a selected sector of the plurality of sectors of the array, the selected sector including memory cells being read during the read operation, the control gate word line associated with the selected sector being a control gate word line of the plurality of control gate word lines;
    wherein the read voltage is supplied by a voltage regulator, wherein prior to the read operation, the voltage regulator is disabled, power is supplied to at least some devices of the memory, and the plurality of control gate word lines are in a floating state;

wherein as part of the read operation, the voltage regulator is enabled while supplying power to the control gate word line associated with the selected sector of the plurality of sectors of the array and the voltage regulator does not supply power to the control gate word lines associated with non selected sectors.

14. A memory comprising:

an array of multi-gate memory cells arranged in a plurality of sectors, each memory cell of the array including a control gate;

a plurality of control gate word lines, each of the plurality of control gate word lines is coupled to an associated sector of the plurality of sectors;

a plurality of driver circuits, each of the plurality of driver circuits is coupled to an associated control gate word line of the plurality of control gate word lines, wherein during a read operation in at least one mode of operation, the plurality of driver circuits operate non selected control gate word lines of the plurality of control gate word lines in a floating state and apply a read voltage to a control gate word line of the plurality of control gate word lines associated with a selected sector of the plurality of sectors;

wherein during a second mode of operation, the plurality of driver circuits apply a read voltage to control gate word lines of the plurality of control gate word lines associated with selected and non selected sectors of the plurality of sectors.

15. A memory comprising:

an array of multi-gate memory cells arranged in a plurality of sectors, each memory cell of the array including a control gate;

a plurality of control gate word lines, each of the plurality of control gate word lines is coupled to an associated sector of the plurality of sectors;

a plurality of driver circuits, each of the plurality of driver circuits is coupled to an associated control gate word line of the plurality of control gate word lines, wherein during a read operation in at least one mode of operation, the plurality of driver circuits operate non selected control gate word lines of the plurality of control gate word lines in a floating state and apply a read voltage to a control gate word line of the plurality of control gate word lines associated with a selected sector of the plurality of sectors;

wherein each driver circuit of the plurality of driver circuits includes a stack of transistors including and N-channel transistor and a P-channel transistor, wherein when a driver circuit of the plurality of driver circuits places its associative control gate word line in a floating state, the N-channel transistor and P-channel transistor are each placed in a non conductive state.

16. The memory of claim 15, wherein when a driver circuit of the plurality of driver circuits applies a read voltage its associated control gate word line, the N-channel transistor is placed in a conductive state.

17. The memory of claim 5 wherein the multi-gate memory cells of the array are characterized as split gate memory cells.

18. The memory of claim 14 wherein the multi-gate memory cells of the array are characterized as split gate memory cells.

\* \* \* \* \*